(12) United States Patent  
Funakubo

(10) Patent No.: US 7,573,180 B2
(45) Date of Patent: Aug. 11, 2009

(54) ULTRASONIC MOTOR

(75) Inventor: Tomoki Funakubo, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/881,979

(22) Filed: Jul. 30, 2007

(65) Prior Publication Data

US 2008/0030101 A1 Feb. 7, 2008

(30) Foreign Application Priority Data

Aug. 3, 2006 (JP) .............................. 2006-212125

(51) Int. Cl.
*H02N 2/00* (2006.01)
*H01L 41/047* (2006.01)
*H01L 41/09* (2006.01)
*H01L 41/107* (2006.01)

(52) U.S. Cl. ............. 310/316.01; 310/317; 310/323.02; 310/323.16; 310/323.17; 310/323.21; 310/366

(58) Field of Classification Search ............ 310/316.01, 310/316.02, 317, 323.01–323.19, 323.21, 310/365, 366
See application file for complete search history.

(56) References Cited

U.S. PATENT DOCUMENTS

| | | | | |
|---|---|---|---|---|
| 5,656,881 A | * | 8/1997 | Atsuta ................ | 310/316.01 |
| 5,739,621 A | * | 4/1998 | Atsuta et al. ........... | 310/316.02 |
| 5,821,667 A | * | 10/1998 | Takagi et al. ............... | 310/317 |
| 6,051,911 A | | 4/2000 | Kojima et al. | |
| 6,133,671 A | * | 10/2000 | Atsuta et al. ........... | 310/316.01 |
| 6,252,332 B1 | * | 6/2001 | Takagi et al. ............ | 310/323.02 |
| 7,116,033 B2 | * | 10/2006 | Seki et al. ................... | 310/317 |
| 7,183,691 B2 | * | 2/2007 | Yamamoto ............. | 310/316.01 |
| 2002/0036445 A1 | * | 3/2002 | Iino et al. .............. | 310/323.16 |
| 2006/0001331 A1 | * | 1/2006 | Nagahama ............. | 310/316.01 |
| 2006/0061235 A1 | * | 3/2006 | Funakubo .............. | 310/323.16 |
| 2006/0061241 A1 | * | 3/2006 | Sasaki ........................ | 310/366 |
| 2008/0036333 A1 | * | 2/2008 | Funakubo et al. ...... | 310/323.02 |
| 2008/0164783 A1 | * | 7/2008 | Okada ................... | 310/323.16 |

FOREIGN PATENT DOCUMENTS

JP 07-193291 7/1995

* cited by examiner

*Primary Examiner*—Thomas M Dougherty
(74) *Attorney, Agent, or Firm*—Scully, Scott, Murphy & Presser, P.C.

(57) ABSTRACT

The invention provides an ultrasonic motor including internal electrodes provided in an ultrasonic vibrator and disposed in regions where electrical charges of the same sign are generated in one vibration mode and where electrical charges of opposite sign and substantially the same amount are generated in another vibration mode; and a control unit configured to detect a phase difference between a vibration detection signal detected on the basis of electrical signals from the internal electrodes and any one of driving AC voltages, and to set a driving frequency such that the phase difference becomes a reference phase difference. Each driving AC voltage with the driving frequency set by the control unit is applied to the ultrasonic vibrator.

4 Claims, 16 Drawing Sheets

FIG. 24
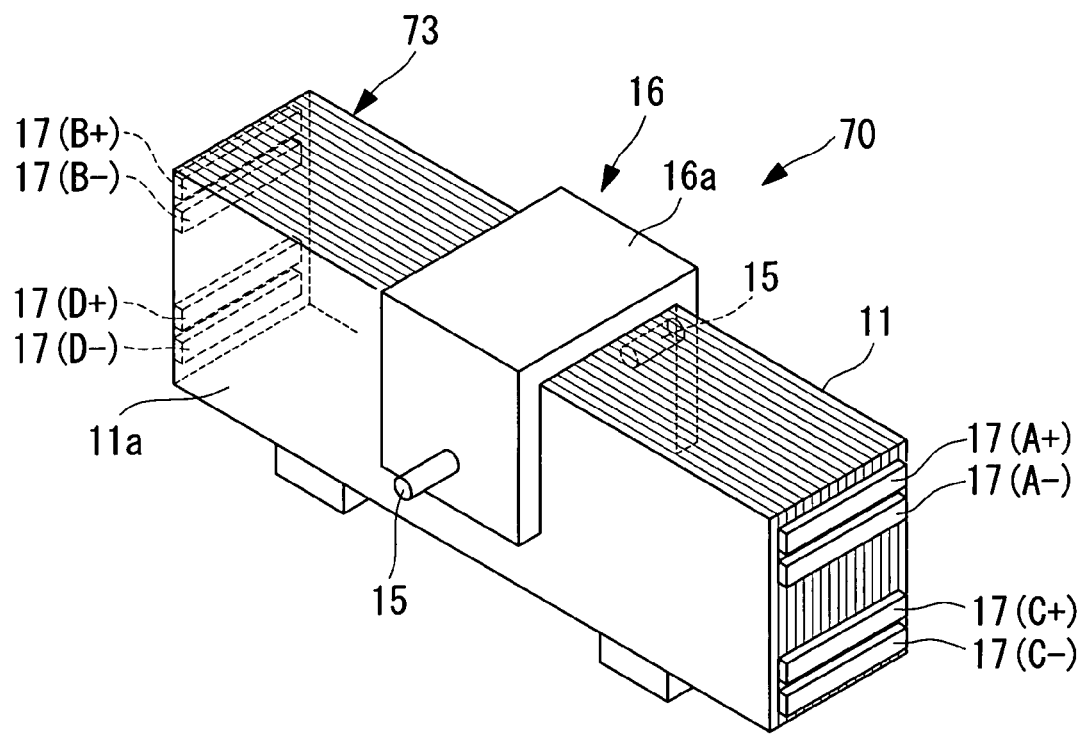
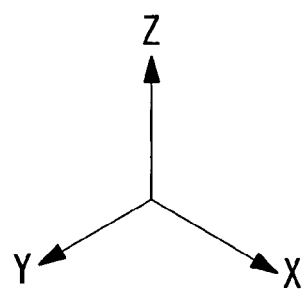

ULTRASONIC MOTOR

BACKGROUND OF THE INVENTION

1. Field of the Invention

The present invention relates to ultrasonic motors.

This application is based on Japanese Patent Application No. 2006-212125, the content of which is incorporated herein by reference.

2. Description of Related Art

Recently, ultrasonic motors have been drawing attention as a new type of motor replacing electromagnetic motors. Ultrasonic motors have the following advantages over known electromagnetic motors:

1) Ultrasonic motors are capable of high torque without using gears;
2) Ultrasonic motors have holding force when powered off;
3) Ultrasonic motors have high resolution;
4) Ultrasonic motors are quiet; and
5) Ultrasonic motors do not generate magnetic noise and are unaffected by noise.

A known ultrasonic motor is described in Japanese Unexamined Patent Application, Publication No. HEI-7-193291. In this ultrasonic motor, internal electrodes for detecting vibrations are provided on some layered piezoelectric elements, which enables a vibration mode to be detected.

However, the vibration mode which can be detected using the ultrasonic motor described above is only a flexural vibration mode generated in a cylindrical rod-shaped vibrator. Accordingly, in a vibrator that simultaneously generates a longitudinal vibration mode and a flexural vibration mode, each vibration mode cannot be independently detected using the internal electrodes disclosed in Japanese Unexamined Patent Application, Publication No. HEI-7-193291; this is a problem because a separate, special device is thus required.

BRIEF SUMMARY OF THE INVENTION

An object of the present invention is to provide an ultrasonic motor that can easily detect both a longitudinal vibration mode and flexural vibration mode independently.

The present invention provides an ultrasonic motor which, by applying two-phase driving AC voltages to an ultrasonic vibrator, simultaneously produces two different vibration modes in the ultrasonic vibrator, giving rise to a substantially elliptical vibration at an output end of the ultrasonic vibrator to move the ultrasonic vibrator and a driven body that is in contact with the ultrasonic vibrator relative to each other. The ultrasonic motor includes internal electrodes provided in the ultrasonic vibrator and disposed in regions where electrical charges of the same sign are generated in one of the vibration modes and where electrical charges of opposite sign and substantially the same amount are generated in the other vibration mode; and a control unit configured to detect a vibration detection signal on the basis of electrical signals from the internal electrodes, to detect a phase difference between the vibration detection signal and any one of the driving AC voltages, to set a driving frequency such that the phase difference becomes a prescribed value, and to apply each driving AC voltage with the set driving frequency to the ultrasonic vibrator.

With this configuration, because the internal electrodes are provided in regions where electrical charges of the same sign are generated in one vibration mode and electrical charges of opposite sign are generated in the other vibration mode, it is possible for the output signals of the internal electrodes to serve as an electrical signal corresponding to the electrical charge generated in the one vibration mode. In other words, because the total electrical charge in the regions becomes zero due to electrical charges of substantially the same amount and opposite sign being generated in the other vibration mode, the output signal from the internal electrodes corresponds to the electrical charge generated in the one vibration mode. Accordingly, one of the two vibration modes produced in the ultrasonic vibrator can be independently detected as an electrical signal.

With the configuration described above, the phase difference between the vibration detection signal detected on the basis of the electrical signals output from the internal electrodes and any one of the driving AC voltages applied to the ultrasonic vibrator is detected, the driving frequency is set so that the phase difference becomes the prescribed value, and the driving frequency is fed back to control the ultrasonic vibrator.

Thus, it is possible to control the driving AC voltages according to the actual vibration mode produced in the ultrasonic vibrator.

When the internal electrodes are disposed at a plurality of locations in the ultrasonic vibrator, the total electrical charge generated in the regions where the internal electrodes are disposed should satisfy the condition described above, namely, that electrical charges of the same sign be generated in one vibration mode and electrical charges of opposite sign and substantially the same amount be generated in the other vibration mode.

In the ultrasonic motor described above, the prescribed value may be set according to a motor speed.

By setting the prescribed value according to the motor speed in this way, it is possible to set a desired motor speed.

In the ultrasonic motor described above, the control unit may include a signal generator configured to generate two-phase driving control signals having the set driving frequency and the prescribed phase difference; and a driving circuit configured to generate the two-phase driving AC voltages with the driving frequency and the prescribed phase difference on the basis of the two-phase driving control signals output from the signal generator, and to apply the generated driving AC voltages to the ultrasonic vibrator. The control unit may detect a phase difference between any one of the driving control signals output from the signal generator and the vibration detection signal.

With this configuration, two-phase driving control signals with the set driving frequency and the prescribed phase difference are output from the signal generator to the driving circuit. The two-phase driving AC voltages with the same driving frequency and the prescribed phase difference are generated in the driving circuit based on the two-phase driving control signals, and these two-phase driving AC voltages are applied to the ultrasonic vibrator. In addition, the phase difference is detected using the driving control signals output from the signal generator. Here, the two-phase driving control signals output from the signal generator to the driving circuit have low noise compared with the two-phase driving AC voltages applied to the ultrasonic vibrator from the driving circuit. Thus, because the low-noise driving control signals are used, it is possible to improve the accuracy of the phase-difference detection.

In the ultrasonic motor described above, the ultrasonic vibrator may include a piezoelectric layered body in which a plurality of piezoelectric elements are laminated, and the internal electrodes are provided on at least one of the piezoelectric elements.

In the ultrasonic motor described above, the two vibration modes are, for example, a longitudinal vibration mode and a flexural vibration mode.

This invention provides an advantage in that it is possible to easily detect both a longitudinal vibration mode and a flexural vibration mode independently.

BRIEF DESCRIPTION OF THE SEVERAL VIEWS OF THE DRAWINGS

FIG. 24 is a perspective view showing an ultrasonic vibrator of the ultrasonic motor according to the second embodiment of the present invention.

DETAILED DESCRIPTION OF THE INVENTION

An ultrasonic motor according to an embodiment of the present invention will be described below with reference to the drawings.

FIRST EMBODIMENT

Figure 1:
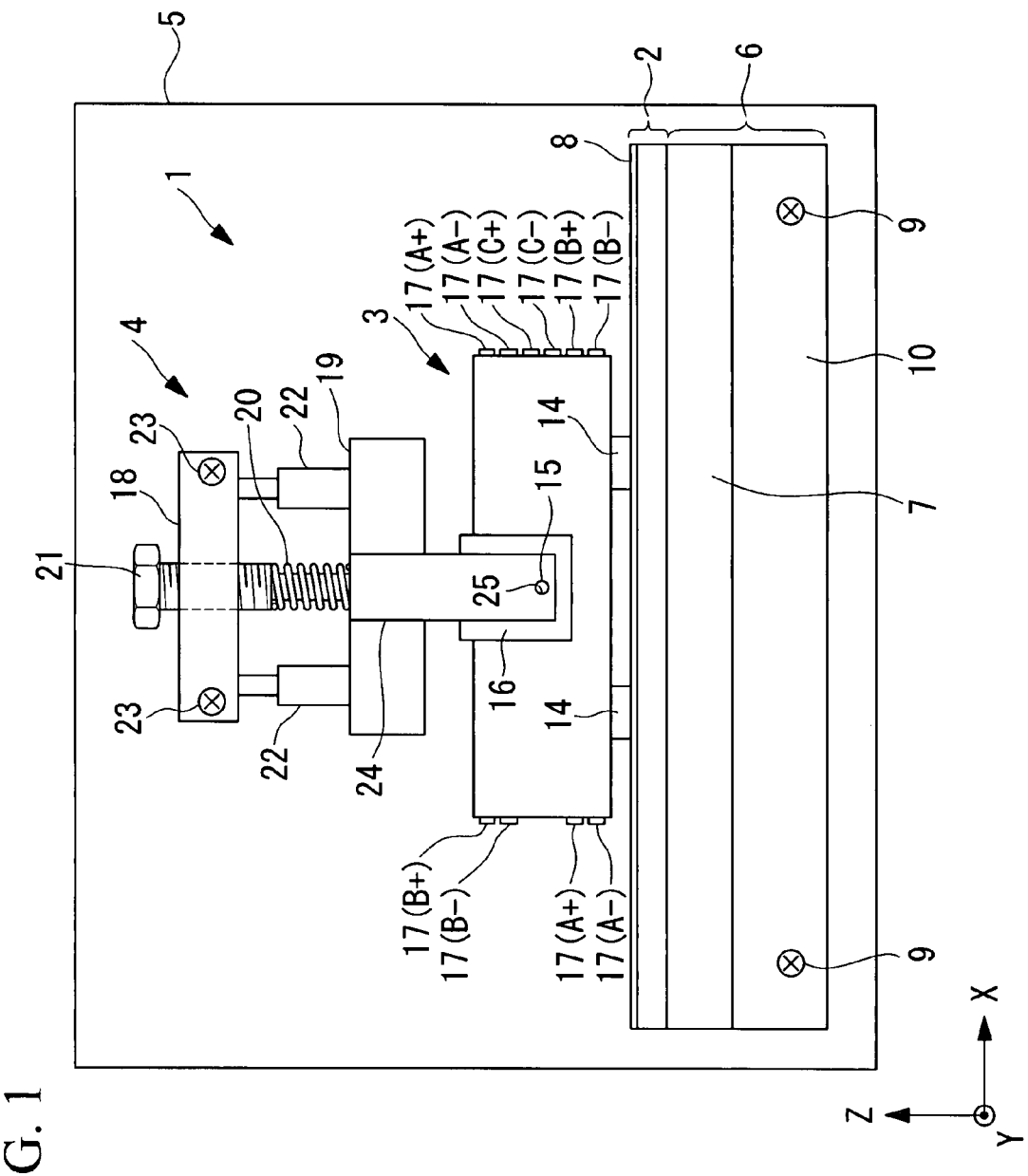
FIG. 1 is a diagram showing the overall configuration of an ultrasonic motor according to a first embodiment of the present invention.

As shown in FIG. 1, an ultrasonic motor 1 according to the first embodiment of the present invention includes a driven body 2, an ultrasonic vibrator 3 disposed in contact with the driven body 2, and a pressing unit 4 for pressing the ultrasonic vibrator 3 against the driven body 2. The driven body 2 is fixed to a movable member 7 of a linear bearing 6, which is secured to a base 5. A sliding plate 8 made of, for example, zirconia ceramic is bonded to the driven body 2 on the surface contacting the ultrasonic vibrator 3. Screws 9 secure a fixed member 10 of the linear bearing 6 to the base 5.

As shown in FIGS. 2 to 5, the ultrasonic vibrator 3 includes a rectangular-block-shaped piezoelectric layered member 13, two friction-contact members (output terminals) 14 bonded to one side surface of the piezoelectric layered member 13, and a vibrator holding member 16. The piezoelectric layered member 13 is made up of a stack of rectangular piezoelectric ceramic sheets (piezoelectric elements) 11. On one side of each of the piezoelectric ceramic sheets 11, sheets of inner electrodes 12 are provided (refer to FIG. 4). The vibrator holding member 16 has pins 15 projecting from side surfaces adjacent to the side surface on which the friction-contact members 14 are provided.

Figure 3:
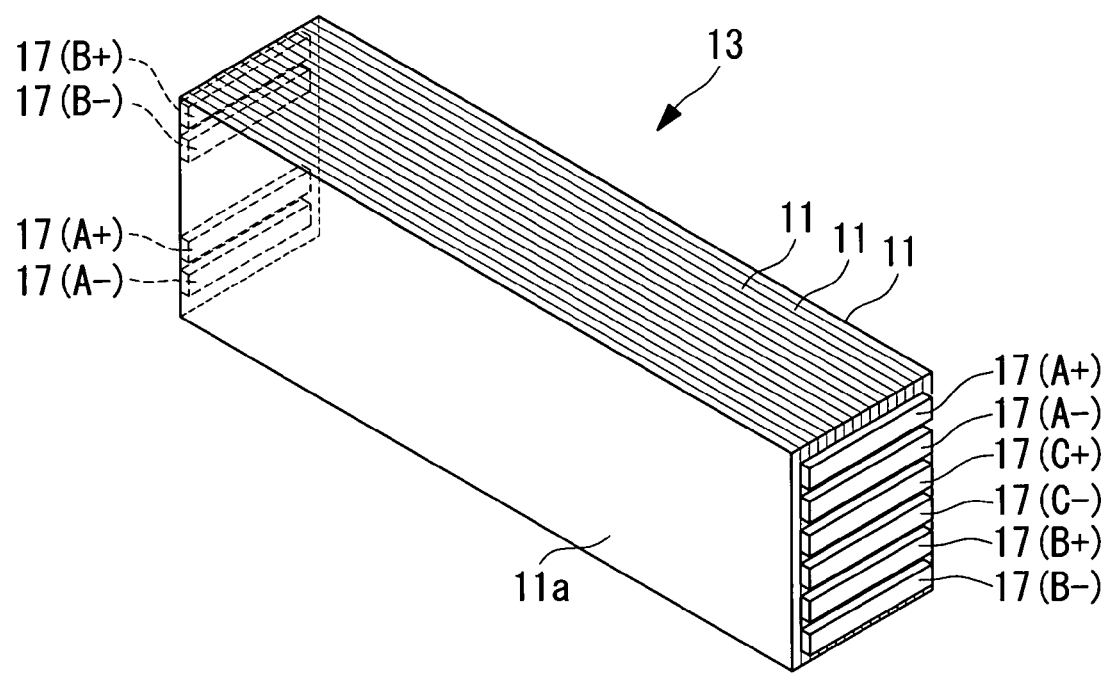
FIG. 3 is a perspective view showing a piezoelectric layered member constituting the ultrasonic vibrator in FIG. 2.

As shown in FIG. 3, the outer dimensions of the piezoelectric layered member 13 are, for example, a length of 18 mm, a width of 4.4 mm, and a thickness of 2 mm.

Figure 4:
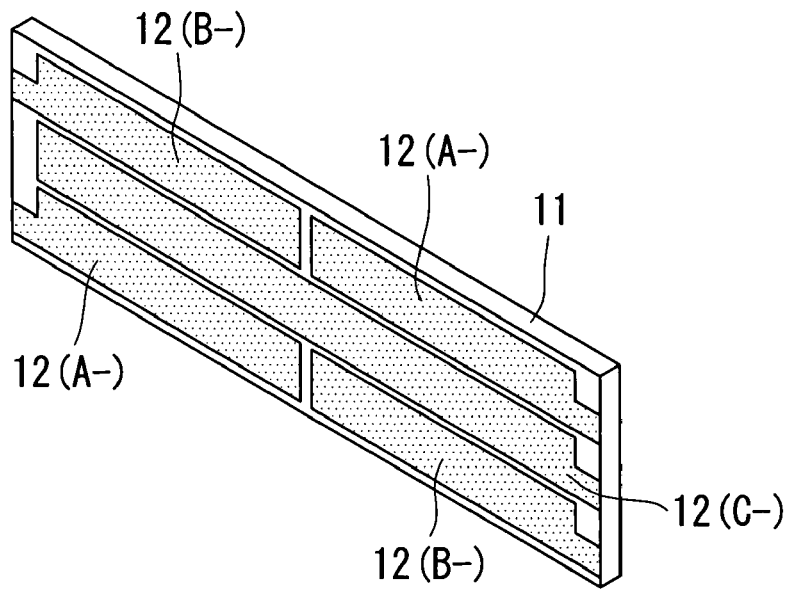
FIG. 4 is a perspective view showing a piezoelectric ceramic sheet constituting the piezoelectric layered member in FIG. 3.
Figure 5:
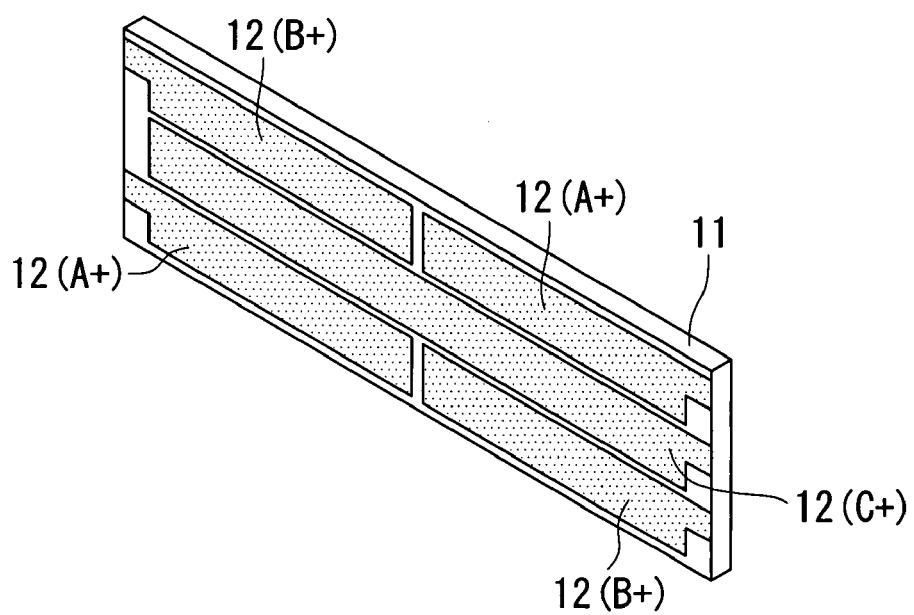
FIG. 5 is a perspective view showing a piezoelectric ceramic sheet constituting the piezoelectric layered member in FIG. 3.

As shown in FIGS. 4 and 5, the piezoelectric ceramic sheets 11 constituting the piezoelectric layered member 13 are, for example, lead zirconate titanate (hereinafter referred to as PZT) piezoelectric ceramic elements having a thickness of about 80 µm. For the PZT, a hard-type PZT having a large Qm value is selected. The Qm value is about 1,800.

The inner electrodes 12, for example, are composed of silver-palladium alloy and have a thickness of about 4 µm. A piezoelectric ceramic sheet 11a (see FIG. 2) disposed at one end in the layering direction does not have any inner electrodes 12. The other piezoelectric ceramic sheets 11 include two different types of inner electrodes 12. The two different types of inner electrodes 12 are illustrated in FIG. 4.

Figure 8:
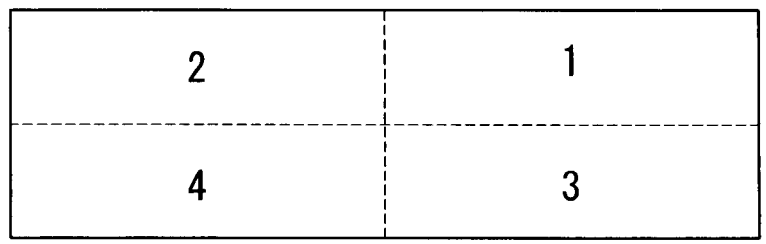
FIG. 8 is a diagram for explaining the electrical charge state produced on internal electrodes provided on the ceramic sheet, wherein the ceramic sheet in divided into four regions of the same shape (rectangular) and the same surface area.

The piezoelectric ceramic sheets 11 shown in FIGS. 4 and 5 have the inner electrodes 12 over substantially the entire surfaces thereof. The inner electrodes 12 include a strip-shaped inner electrode disposed along the longitudinal direction of the ceramic sheet 11 at the central area in the width direction of the ceramic sheet 11 and four internal electrodes of substantially the same size disposed around the central electrode. The four surrounding inner electrodes are separated from the central electrode by insulating distances of about 0.4 mm in the width direction of the piezoelectric ceramic sheet 11 and are separated by insulating distances of about 0.4 mm in the longitudinal direction of the piezoelectric ceramic sheet 11. The strip-shaped inner electrodes 12 (C−) and 12 (C+) shown in FIGS. 4 and 5 are vibration-detecting inner electrodes; they are disposed so that, if the piezoelectric ceramic sheet 11 is divided into first to fourth regions by splitting it into two equal parts in the length direction and two equal parts in the width direction, as shown in FIG. 8, for example, the surface areas occupied by the respective regions are substantially equal. The inner electrodes 12 are disposed with a gap of about 0.4 mm from the edges of the piezoelectric ceramic sheet 11, and portions thereof extend to the edges of the piezoelectric ceramic sheet 11.

The rectangular block-shaped piezoelectric layered member 13 is formed by alternately laminating the piezoelectric ceramic sheets 11 shown in FIG. 4 and those shown in FIG. 5, which are provided with these inner electrodes 12.

A total of ten external electrodes 17 are provided on the piezoelectric layered member 13, six on one end face in the longitudinal direction and four on the other end face in the longitudinal direction. The external electrodes 17 are each connected to a group of inner electrodes 12 provided at the same position on the same type of piezoelectric ceramic sheets 11. In this way, the inner electrodes 12 provided at the same position on the same type of piezoelectric ceramic sheets 11 have the same electric potential. The external electrodes 17 are connected to a control unit, to be described later (see FIG. 11), via wiring lines (not shown in the drawings). The wiring lines may be any type of flexible wiring, such as lead wires or flexible substrates.

The piezoelectric layered member 13 is manufactured, for example, as described below.

To manufacture the piezoelectric layered member 13, first, the piezoelectric ceramic sheets 11 are prepared. The piezoelectric ceramic sheets 11 are prepared, for example, by casting a slurry mixture of a calcinated powder of PZT and a predetermined binder onto a film using a doctor blade method, drying the mixture, and removing the dried mixture from the film.

The material for the inner electrodes 12 is printed on each of the prepared piezoelectric ceramic sheets 11 using a mask having a pattern for the inner electrode 12. First, the piezoelectric ceramic sheet 11a with no inner electrode 12 is provided. Then, the two types of piezoelectric ceramic sheets 11 having different-shaped inner electrodes 12 are carefully aligned and alternately stacked on the piezoelectric ceramic sheet 11a with the inner electrodes 12 facing downward towards the piezoelectric ceramic sheet 11a. The stacked piezoelectric ceramic sheets 11 are bonded by thermocompression, cut into a predetermined shape, and fired at a temperature of about 1,200° C. In this way, the piezoelectric layered member 13 is manufactured.

Subsequently, silver is plated onto the inner electrodes 12 exposed at the edges of the piezoelectric ceramic sheets 11 such that the inner electrodes 12 are joined together to form the external electrodes 17.

Finally, a direct-current (DC) high voltage is applied between the opposing inner electrodes 12 to polarize and piezoelectrically activate the piezoelectric ceramic sheets 11.

Next, the operation of the piezoelectric layered member 13, manufactured by the above-described process, will be described.

The six external electrodes 17 formed at one end in the longitudinal direction of the piezoelectric layered member 13 are A-phase (A+ and A−), C-phase (C+ and C−), and B-phase (B+ and B−) electrodes, in this order from the other side face (the top side in FIG. 2) of the piezoelectric layered member 13, and the four external electrodes 17 formed at the other end are B-phase (B+ and B−) and A-phase (A+ and A−) electrodes, in this order from the other side face (the top side in FIG. 2) of the piezoelectric layered member 13. The A-phase and B-phase external electrodes are for driving, and the C-phase external electrodes are for vibration detection.

Figure 6:
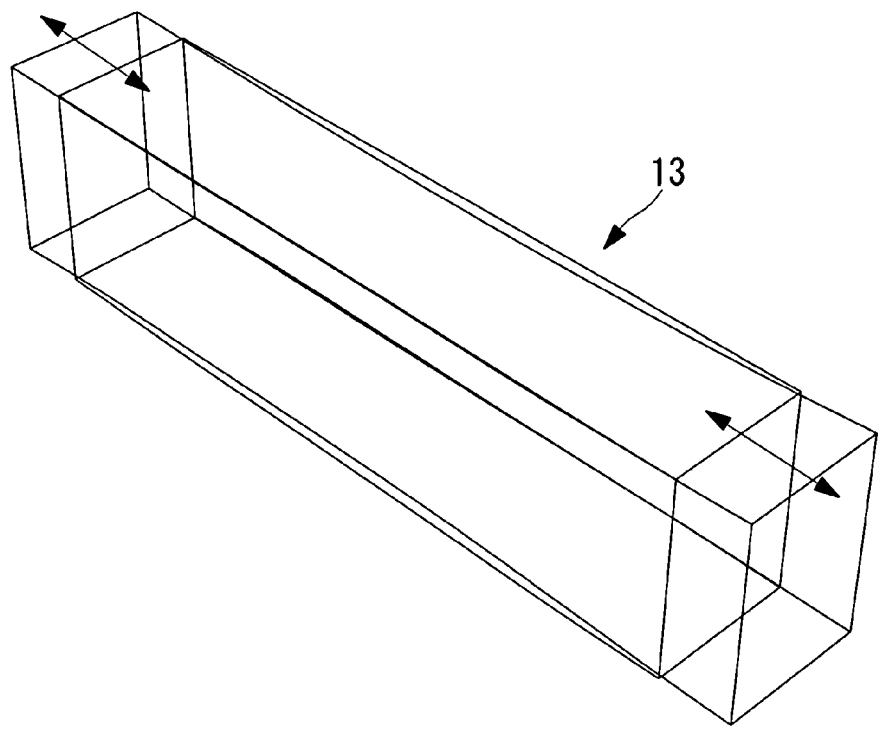
FIG. 6 is a diagram, formed by computer analysis, showing the piezoelectric layered member in FIG. 2 oscillating in a first-order longitudinal vibration mode.
Figure 9:
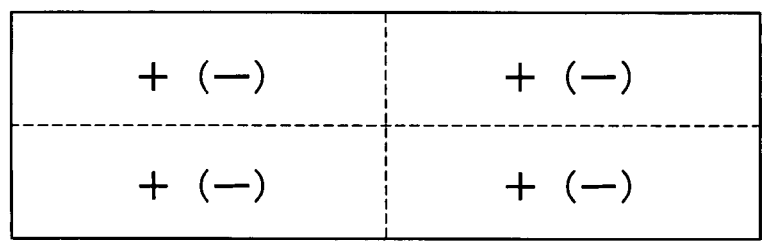
FIG. 9 is a diagram showing the electrical charge state excited in each region shown in FIG. 8 when the longitudinal vibration mode is excited.

By applying driving alternating-current (AC) voltages corresponding to resonant frequencies and having synchronous phases to the A-phase and B-phase external electrodes 17, a first-order longitudinal vibration is excited, as illustrated in FIG. 6. If the piezoelectric ceramic sheets 11 are divided into the first to fourth regions, as shown in FIG. 8, for example, the resulting charges generated in the regions on one face of the piezoelectric ceramic sheets 11 at this time are either positive or negative in all regions simultaneously, as shown in FIG. 9.

Figure 7:
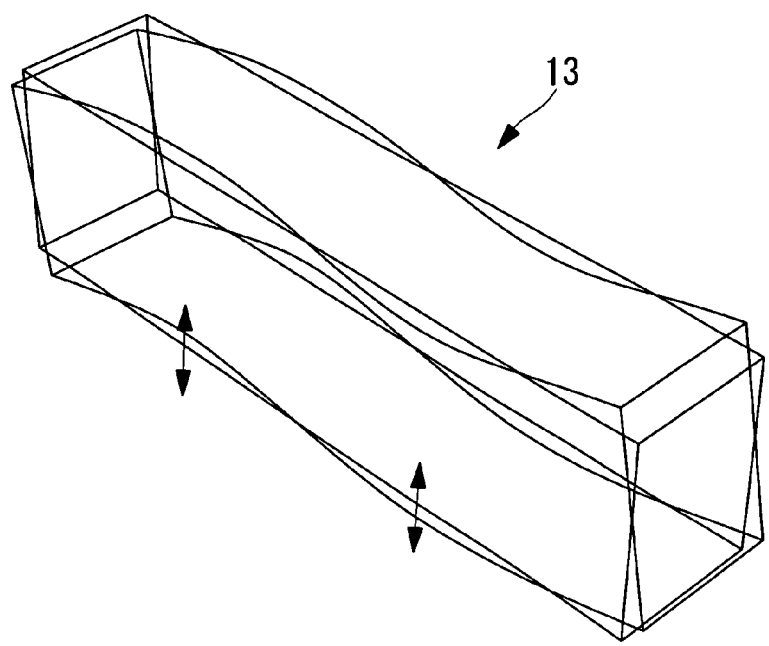
FIG. 7 is a diagram, formed by computer analysis, showing the piezoelectric layered member in FIG. 2 oscillating in a second-order flexural vibration mode.
Figure 10:
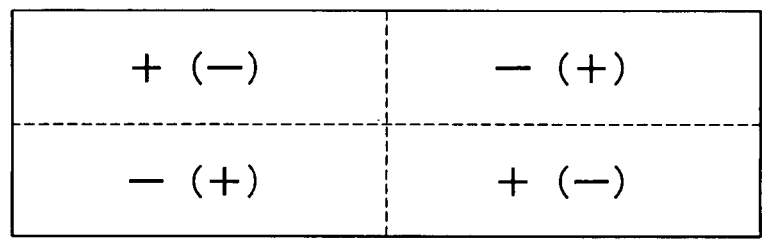
FIG. 10 is a diagram showing the electrical charge state excited in each region shown in FIG. 8 when the flexural vibration mode is excited.

By applying driving AC voltages corresponding to the resonant frequencies and having opposite phases to the A-phase and B-phase external electrodes 17, a second-order flexural vibration is excited, as illustrated in FIG. 7. The charges in each region at this time are as shown in FIG. 10. In other words, when the flexural vibration mode is excited, among the first to fourth regions, charges having the same sign are simultaneously excited in the regions positioned diagonally opposite each other, and charges having different signs are simultaneously excited in neighboring regions.

Next, the output from the C-phase electrodes will be described. In the C-phase, because the corresponding internal electrodes are disposed so that the surface areas occupied in the four regions described above are substantially equal to each other, the electrical charges due to the flexural vibration are cancelled out, and a signal proportional only to the longitudinal vibration is output. The sign of the electrical charges excited is determined by the phase of the vibration.

The friction-contact members 14 are bonded on the piezoelectric layered member 13 at two positions corresponding to the antinodes of the second-order flexural vibration. In this way, the friction-contact members 14 are displaced in the longitudinal direction of the piezoelectric layered member 13 (that is, the X direction in FIG. 2) when a first-order longitudinal vibration is generated in the piezoelectric layered member 13. On the other hand, the friction-contact members 14 are displaced in the width direction of the piezoelectric layered member 13 (that is, the Z direction in FIG. 2) when a second-order flexural vibration is generated in the piezoelectric layered member 13.

Consequently, by applying 90-degree phase-shifted driving AC voltages corresponding to the resonant frequencies to the A-phase and B-phase external electrodes 17 of the ultrasonic vibrator 3, the first-order longitudinal vibration and the second-order flexural vibration are generated simultaneously. As a result, substantially elliptical vibrations in a clockwise or counterclockwise direction are generated at the friction-contact members 14, as indicated by the arrows C in FIG. 2.

Figure 2:
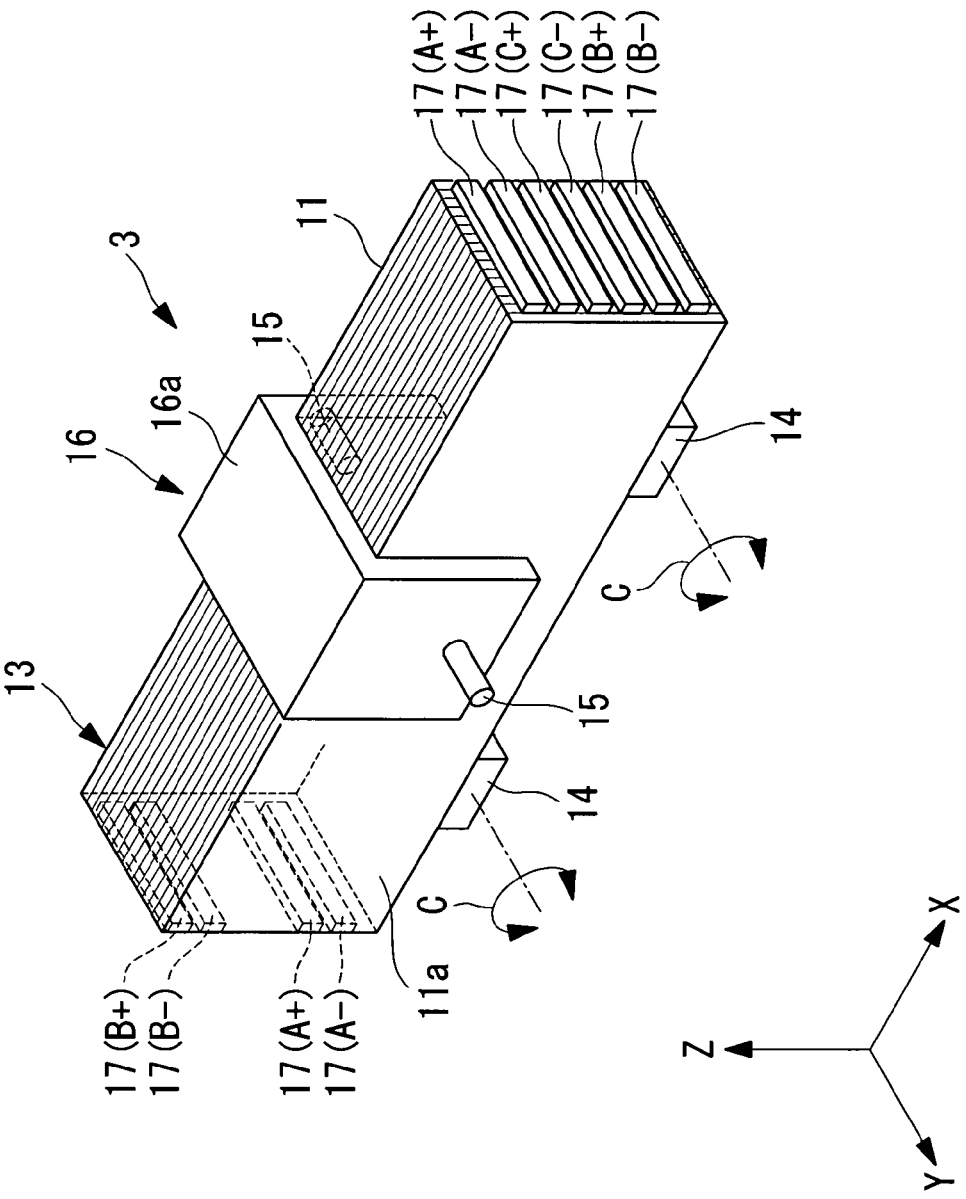
FIG. 2 is a perspective view showing an ultrasonic vibrator of the ultrasonic motor in FIG. 1.

As shown in FIG. 2, the vibrator holding member 16 includes a holding part 16a having a substantially angular-U shape in cross section and the pins 15, integral with the holding part 16a, which project perpendicularly from both sides of the holding part 16a. The holding part 16a covers the piezoelectric layered member 13 from one side in the width direction thereof and is bonded to the piezoelectric layered member 13 with, for example, a silicone resin or an epoxy resin. When the holding part 16a is bonded to the piezoelectric layered member 13, the two pins 15 integrally provided on the sides of the holding part 16a are coaxially disposed at the position of a common node of the longitudinal vibration and the flexural vibration of the piezoelectric layered member 13.

The pressing unit 4, as illustrated in FIG. 1, includes a bracket 18, a pressing unit 19, a coil spring 20, an adjustment screw 21, and guiding bushes 22. The bracket 18 is fixed on the base 5 with screws 23 at a position a predetermined distance away from the ultrasonic vibrator 3 in the width direction (Z direction) on the opposite side of the ultrasonic vibrator 3 from the friction-contact members 14. The pressing unit 19 is supported so that it is movable in the width direction of the ultrasonic vibrator 3 with respect to the bracket 18. The coil spring 20 applies a pressing force to the pressing unit 19, and the adjustment screw 21 adjusts the pressing force. The guiding bushes 22 guide the movement of the pressing unit 19 with respect to the bracket 18. Reference numeral 23 is a screw for securing the bracket 18 to the base 5.

The pressing unit 19 includes two support plates 24 sandwiching the ultrasonic vibrator 3 in the thickness direction thereof. The support plates 24 each have a through-hole 25 for passing the pins 15 of the vibrator holding member 16. The pressing force applied to the pressing unit 19 is transmitted to the ultrasonic vibrator 3 through the support plates 24 and the pins 15 passing through the through-holes 25.

The coil spring 20 is a compression coil spring interposed between the adjustment screw 21 and the pressing unit 19. By changing the fastening position of the adjustment screw 21 with respect to the bracket 18, the amount of elastic deformation of the coil spring 20 is changed so as to change the pressing force applied to the pressing unit 19 in a direction toward the ultrasonic vibrator 3.

Next, a control unit 30 of the ultrasonic motor 1 according to this embodiment is described with reference to FIG. 11.

Figure 11:
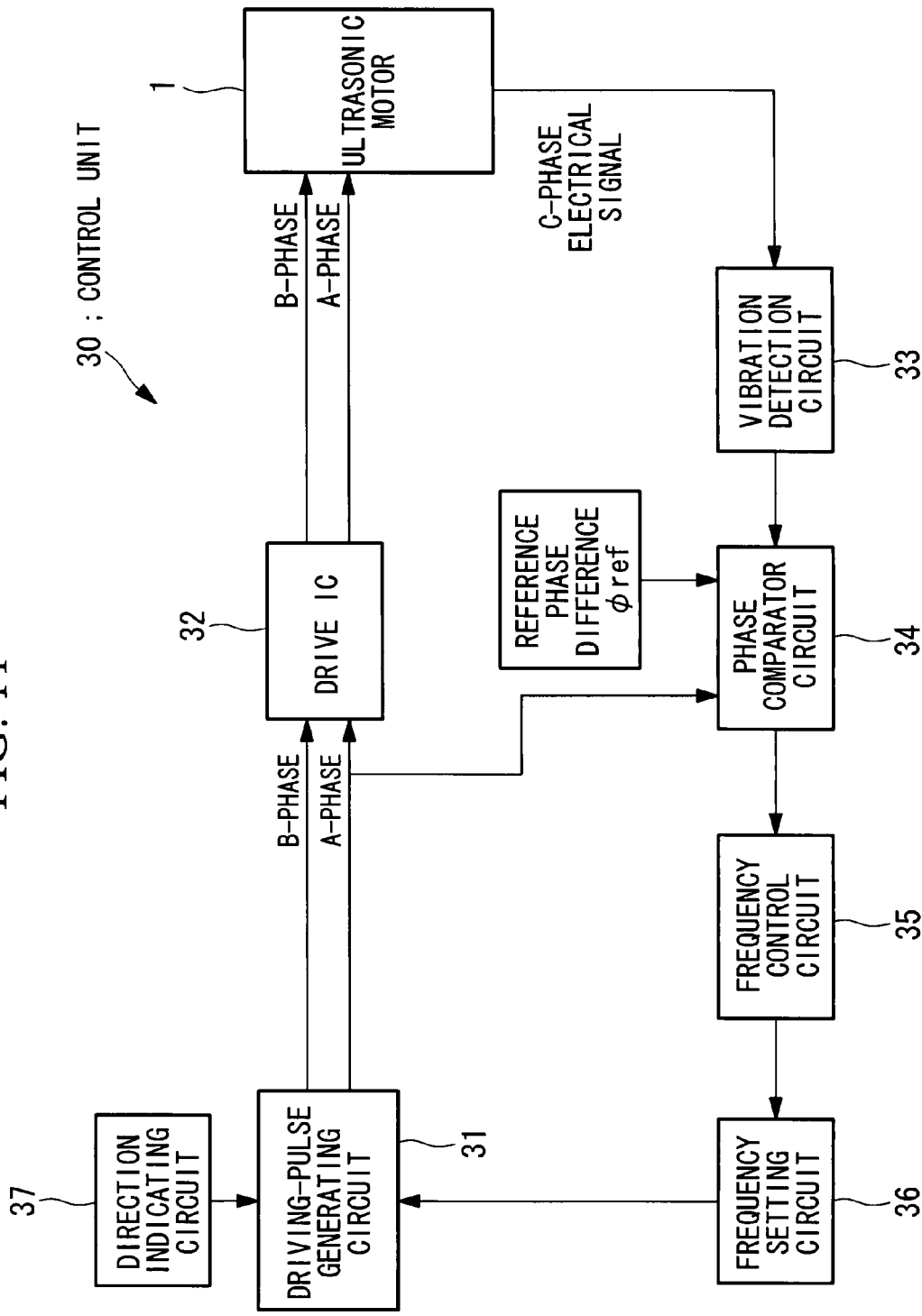
FIG. 11 is a block diagram showing, in outline, the configuration of a control unit according to the first embodiment of the present invention.
Figure 12:
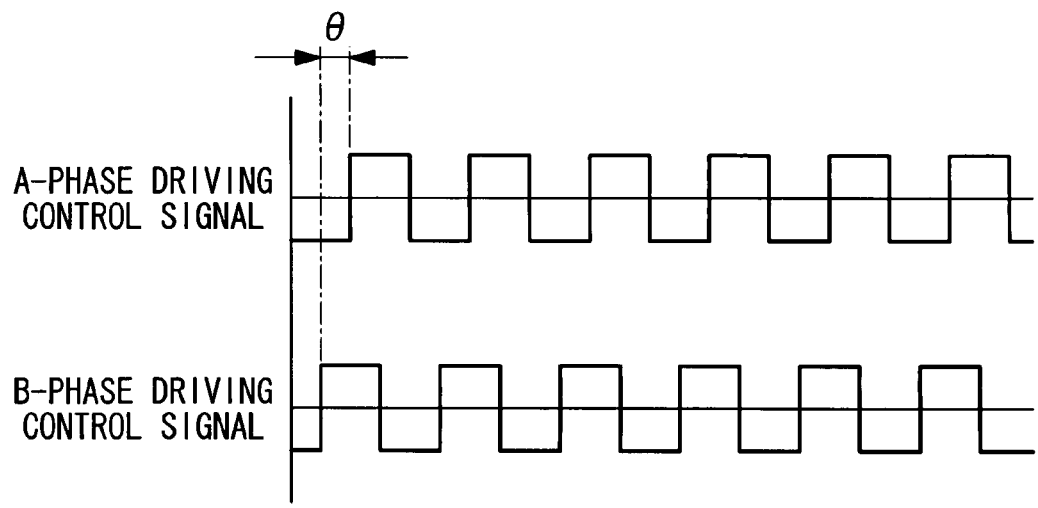
FIG. 12 is a diagram showing two-phase driving control signals generated by a driving-pulse generating circuit.

As shown in FIG. 11, the control unit 30 includes a driving-pulse generating circuit (signal generator) 31 and a drive IC (driving circuit) 32. As shown in FIG. 12, the driving-pulse generating circuit 31 generates two-phase driving control signals having prescribed driving frequencies and a prescribed phase difference $\theta$ and outputs them to the drive IC 32. The prescribed phase difference $\theta$ is, for example, about 90 degrees.

Based on the two-phase driving control signals input from the driving-pulse generating circuit 31, the drive IC 32 generates two-phase driving AC voltages having a prescribed phase difference and prescribed driving frequencies, and applies each driving AC signal to the external electrodes corresponding to the A-phase and the B-phase described above.

The control unit 30 includes a vibration detection circuit 33, a phase comparator circuit 34, a frequency control circuit 35, and a frequency setting circuit 36. The vibration detection circuit 33 is connected to the C-phase external electrodes 17 (C+, C−) shown in FIG. 2 via wiring lines, and based on analog electrical signals (hereinafter referred to as "C-phase electrical signals") from the C-phase external electrodes 17 (C+, C−), it generates a vibration detection signal corresponding to the longitudinal vibration mode produced in the ultrasonic vibrator 3. More specifically, the C-phase electrical signals input via the wiring lines are subjected to various types of signal processing, such as noise removal, binarization, and so forth, and converted to a digital signal, and the resulting digital signal after processing is output as the vibration detection signal.

Figure 13:
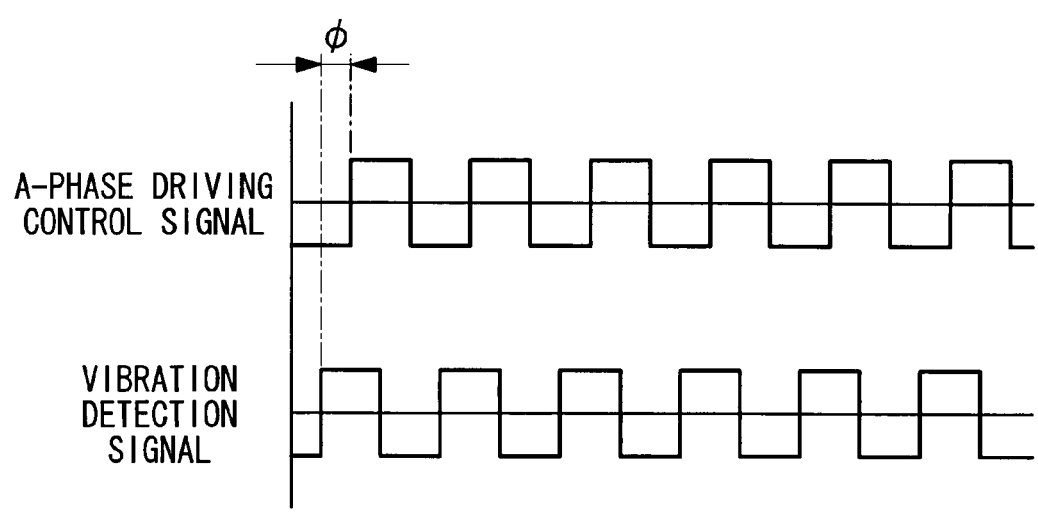
FIG. 13 is a diagram for explaining the processing of a phase comparator circuit.

The vibration detection signal output from the vibration detection circuit 33 and the A-phase driving control signal input to the drive IC 32 are input to the phase comparator circuit 34. As shown in FIG. 13, the phase-comparator circuit 34 determines the phase difference $\phi$ between the vibration detection signal and the A-phase driving control signal, determines a difference $\Delta\phi$ (=$\phi-\phi$ref) between this phase difference $\phi$ and a reference phase difference $\phi$ref stored in advance, and outputs a signal corresponding to this difference $\Delta\phi$.

Figure 14:
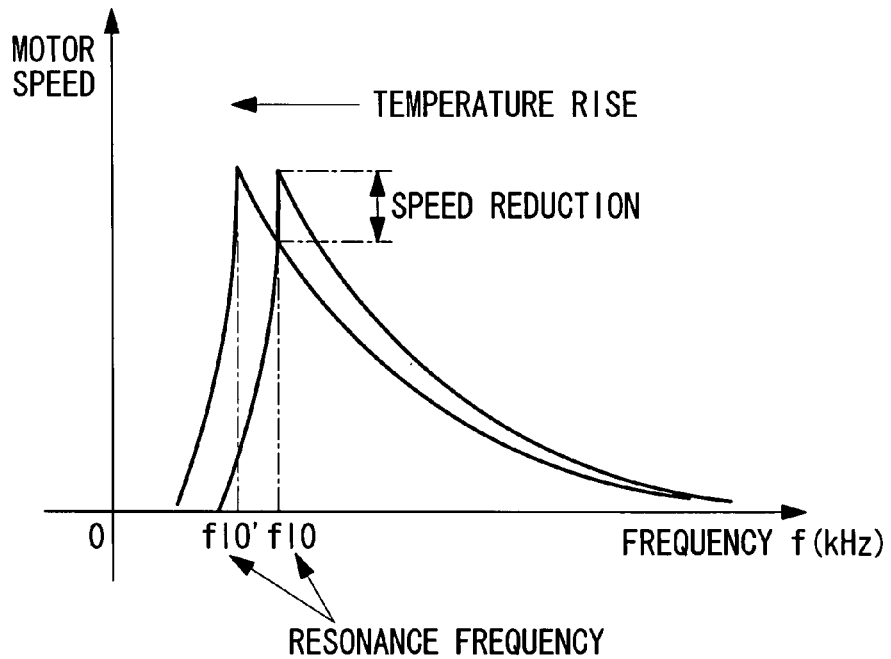
FIG. 14 is a graph showing a motor speed versus frequency relationship in the longitudinal vibration mode.

The ultrasonic motor 1 is known to have good efficiency when driven at the resonance frequency. However, the resonance frequency changes depending on the environmental temperature. More specifically, as shown in FIG. 14, it has a characteristic whereby the resonance frequency decreases as the environmental temperature increases. Therefore, when controlling the ultrasonic motor 1 to obtain the maximum motor speed, it is necessary to change the resonance frequency to follow the changes in temperature.

Figure 15:
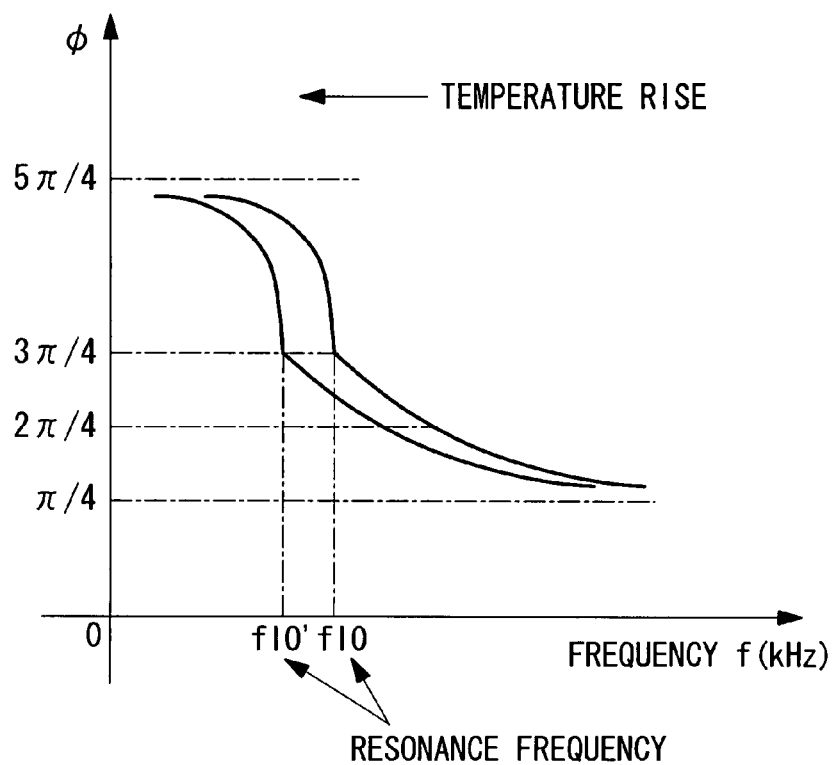
FIG. 15 is a graph showing a phase difference versus frequency characteristic in the longitudinal vibration mode.

In contrast, as shown in FIG. 15, the relationship between the resonance frequency and the phase difference $\phi$ between the vibration detection signal and the A-phase driving control signal is such that the phase difference $\phi$ always remains constant even if the resonance frequency changes when the temperature is increased. This indicates that a constant motor speed can always be obtained if the resonance frequency is controlled so that the phase difference $\phi$ between the vibration detection signal and the A-phase driving control signal is always constant. Thus, in this embodiment, the resonance frequency is controlled so that the phase difference $\phi$ between the A-phase driving control signal and the vibration detection signal is always constant.

In this embodiment, the reference phase difference $\phi$ref is set to $3\pi/4$, and the resonance frequency is controlled so that the phase difference $\phi$ between the A-phase driving control signal and the vibration detection signal is always the reference phase difference $3\pi/4$. The reason is because, when the reference phase difference is $3\pi/4$, it is possible to drive the ultrasonic motor in the region where the efficiency is optimal, as shown in FIG. 14. The value of the reference phase difference $\phi$ref is not particularly limited, however; it is possible to set it arbitrarily based on the design, according to the driving speed of the ultrasonic motor 1, in other words, the desired motor speed.

Referring again to FIG. 11, the difference $\Delta\phi$ from the phase comparator circuit 34 is input to the frequency control circuit 35. Based on the difference $\Delta\phi$, the frequency control circuit 35 determines a change in frequency $\Delta f$ of the frequency for making the difference $\Delta\phi$ zero, and outputs this change in frequency $\Delta f$. More specifically, when the difference $\Delta\phi$ is a positive value, frequency change $+\Delta f$ for increasing the frequency by a prescribed amount is output, and when the difference $\Delta\phi$ is a negative value, a frequency change $-\Delta f$ for reducing the frequency by a prescribed amount is output. Thus, in this embodiment, sequential control is achieved in this way based on the difference $\Delta\phi$.

The change in frequency $\Delta f$ in frequency from the frequency control circuit 35 is input to the frequency setting circuit 36. The frequency setting circuit 36 includes, for example, an oscillator, a divider circuit, and so forth. The frequency setting circuit 36 generates a clock signal whose frequency is increased or decreased according to frequency change $\Delta f$ from the frequency control circuit 35, and outputs it to the driving-pulse generating circuit 31 described above.

A direction indicating signal from a direction indicating circuit 37 is input to the driving-pulse generating circuit 31. The driving-pulse generating circuit 31 changes the phase difference $\theta$ of the two-phase driving control signals output to the drive IC 32 according to the direction indicating signal. Accordingly, it is possible to switch the direction of the substantially elliptical vibration generated in the friction-contact members 14 of the ultrasonic vibrator 3 to positive rotation or negative rotation. As a result, it is possible to move the driven body 2 in the positive-rotation direction or the negative-rotation direction.

Next, the operation of the control unit 30 will be described.

First, the two-phase driving control signals with the prescribed driving frequencies and prescribed phase difference θ (=90 degrees) are input from the driving-pulse generating circuit 31, and based thereon, two-phase driving AC voltages with the prescribed phase difference and prescribed driving frequencies are respectively applied to the A-phase external electrodes 17 (A+, A−) and the B-phase external electrodes 17 (B+, B−) of the ultrasonic vibrator 3. Accordingly, a longitudinal vibration mode and a flexural vibration mode are simultaneously excited in the ultrasonic vibrator 3, a substantially elliptical vibration is generated in the friction-contact members 14, and the driven body 2 is propelled by means of the friction force generated between the friction-contact members 14 and the sliding plate 8 of the driven body 2 in the tangential direction of the elliptical vibration.

On the other hand, the C-phase electrical signals corresponding to the longitudinal vibration mode of the ultrasonic vibrator 3 are input to the vibration detection circuit 33 via the external electrodes 17 (C+, C−) and the wiring lines. The C-phase electrical signals are converted to a digital signal in the vibration detection circuit 33, which is then input to the phase comparator circuit 34 as a vibration detection signal. For the vibration detection signal input to the phase-comparator circuit 34, the phase difference φ is determined by comparison with the A-phase driving control signal, and by determining the difference Δφ between this phase difference φ and the reference phase difference φref, a signal corresponding to the difference Δφ is output to the frequency control circuit 35. The sign (plus or minus) of the frequency change Δf is determined based on the sign (plus or minus) of the difference Δφ, and the frequency change Δf is output to the frequency setting circuit 36. The frequency setting circuit 36 generates a clock signal whose frequency is changed according to the frequency change Δf, and the clock signal is output to the driving-pulse generating circuit 31. Accordingly, feedback control is performed such that the phase difference φ between the A-phase driving control signal and the vibration detection signal becomes the reference phase difference φref, and it is thus possible to drive the ultrasonic motor 1 at the desired resonance frequency according to changes in temperature. Thus, it is possible to realize motor driving that is always stable, regardless of temperature variations.

As described above, with the ultrasonic motor 1 according to this embodiment, the internal electrodes 12 corresponding to the C-phase, that is, the internal electrodes 12 for vibration detection, are disposed at positions such that the total electrical charge generated in each region by the longitudinal vibration mode takes a finite value, and the total electrical charge generated in each region by the flexural vibration mode cancels out to become zero. Therefore, it is possible to detect only the longitudinal vibration mode via the internal electrodes 12 for vibration detection.

By setting the frequency close to the frequency where the longitudinal vibration of the vibrator is maximized, it is possible to drive the ultrasonic motor with good efficiency, and it is thus possible to obtain a high motor output.

With the ultrasonic motor 1 according to this embodiment, a vibration detection signal of the longitudinal vibration mode is generated based on the C-phase electrical signals, and the frequencies of the two-phase driving control signals are subjected to feedback control so that the phase difference φ between the vibration detection signal and the A-phase driving control signal becomes the reference phase difference φref. Therefore, even if the environmental temperature changes, it is always possible to keep the motor speed constant. Accordingly, it is possible to realize stable motor driving.

In the embodiment described above, the sequential control is realized according to the difference Δφ output from the phase comparator circuit 34. Instead of this, however, the frequency control circuit 35 may store a characteristic table showing the relationship between the frequency f and the phase difference φ between the A-phase driving control signal and the vibration detection signal, as shown in FIG. 16, and using this characteristic table, it may set the frequency f according to the phase difference φ.

More specifically, once the phase comparator circuit 34 determines the phase difference φ between the A-phase driving control signal and the vibration detection signal, it outputs a signal corresponding to this phase difference φ to the frequency control circuit 35. The frequency control circuit 35 obtains the frequency f corresponding to the input phase difference φ by referring to the characteristic table shown in FIG. 16 and outputs this frequency f to the frequency setting circuit 36. By doing so, a clock signal of the frequency f is generated in the frequency setting circuit 36 and is output to the driving-pulse generating circuit 31.

With this configuration, even if the phase difference φ shifts substantially from the reference phase difference φref due to, for example, a sudden change in temperature, it is possible to quickly determine the frequency f corresponding to this shift. Accordingly, it is possible to quickly follow sudden changes in temperature, and the responsiveness can be improved.

Figure 16:
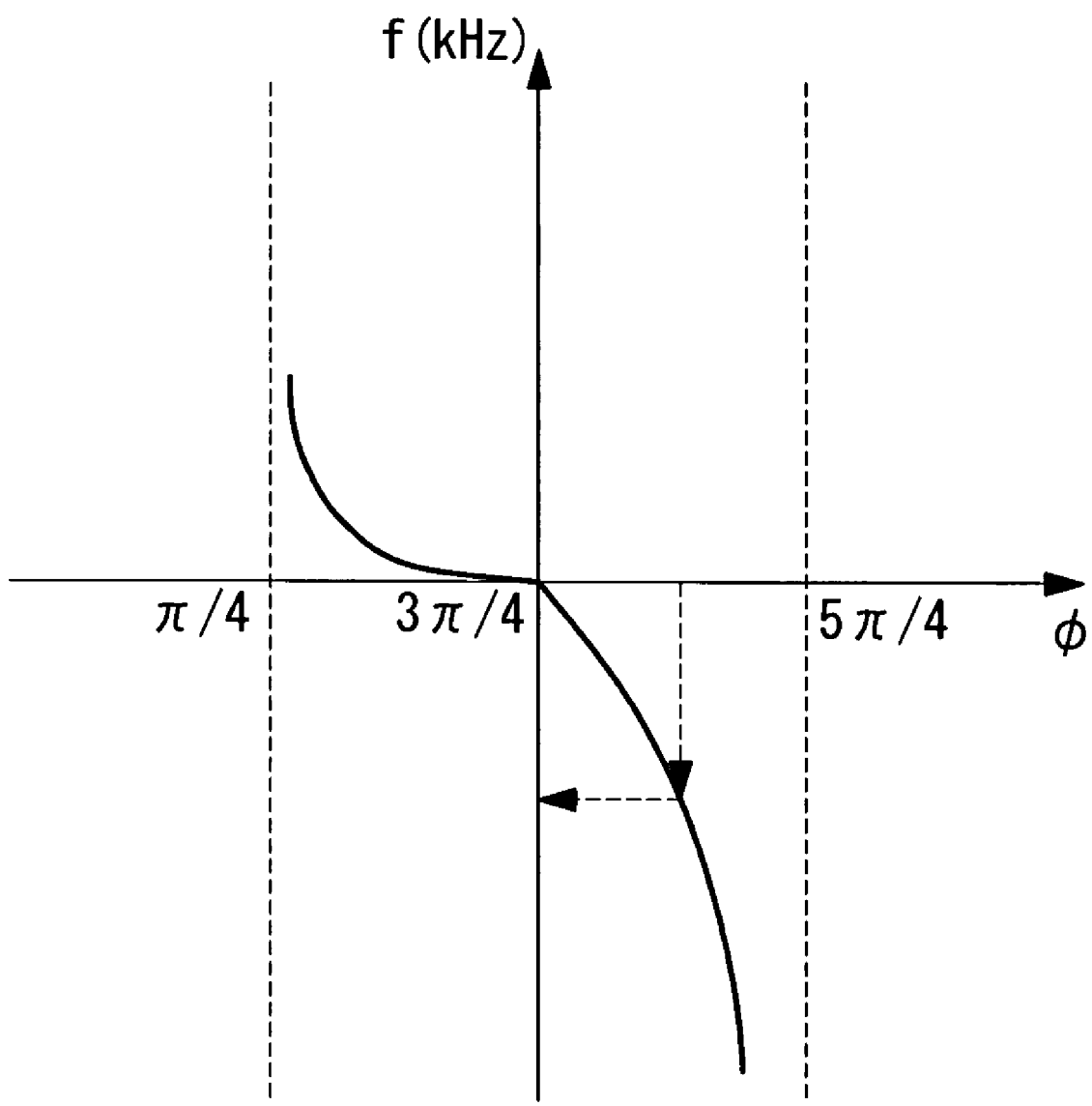
FIG. 16 is a graph showing an example of a frequency f versus phase difference φ characteristic table which a frequency control circuit stores.

It is also possible to determine the frequency f corresponding to the phase difference φ by using a numerical formulae in which the phase difference φ is defined as a parameter, instead of the frequency f versus phase difference φ characteristic table shown in FIG. 16.

In this embodiment, the A-phase driving control signal and the vibration detection signal are compared; however, it is also possible to use the B-phase driving control signal instead of the A-phase driving control signal. In such a case, it is necessary to change the reference phase difference φref according to the phase difference θ between the A-phase driving control signal and the B-phase driving control signal. Furthermore, instead of a two-phase driving control signal, it is possible to use one of the two-phase AC driving voltages applied to the ultrasonic motor 1 from the drive IC 32.

Figure 17:
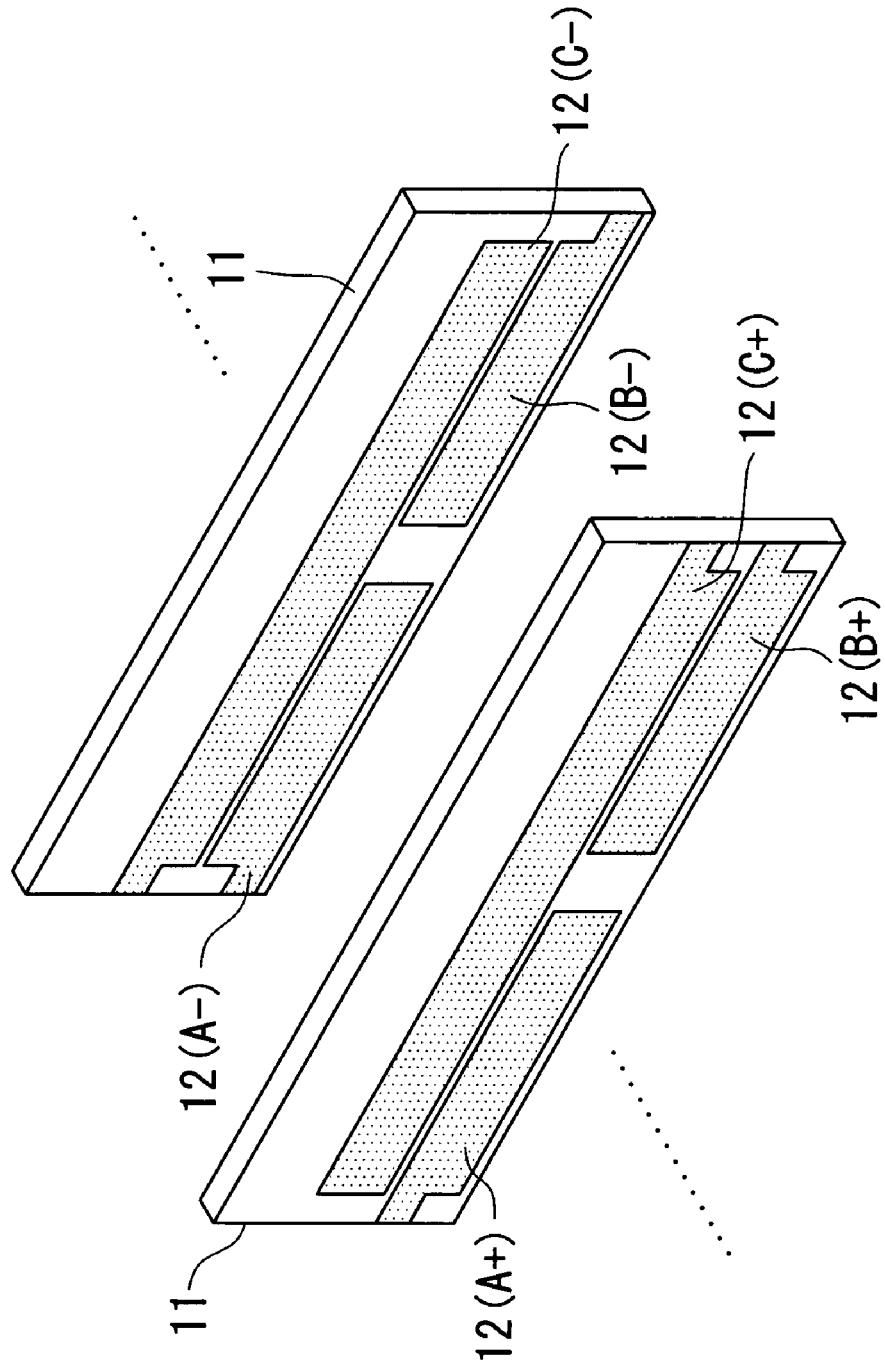
FIG. 17 is a perspective view showing a modification of the piezoelectric ceramic sheet constituting the piezoelectric layered member.
Figure 18:
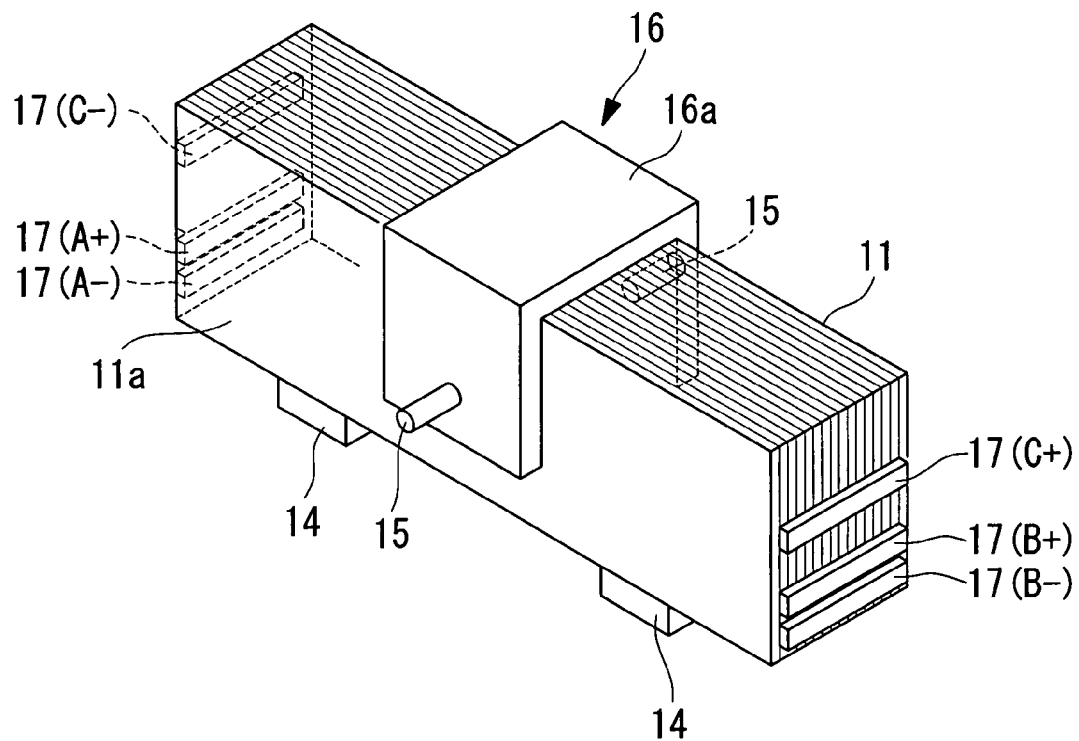
FIG. 18 is a perspective view showing a modification of the ultrasonic vibrator of the ultrasonic motor according to the first embodiment of the present invention.
Figure 19:
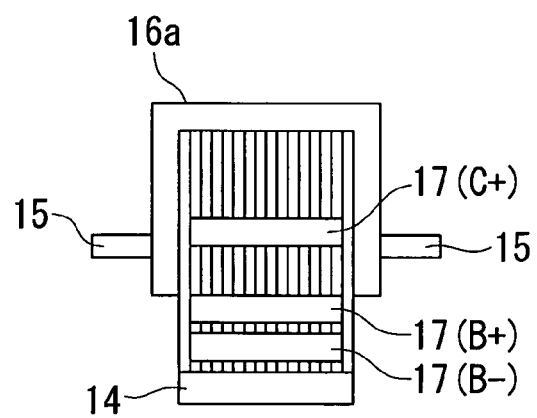
FIG. 19 is a diagram showing the placement of external electrodes of the ultrasonic vibrator shown in FIG. 18.

Next, a modification of the ultrasonic motor of this embodiment is shown in FIGS. 17 to 19. In this modification, of the internal electrodes 12 (A+, A−) and the internal electrodes 12 (B+, B−) for driving, which are disposed so as to flank the internal electrodes 12 (C+, C−) from above and below, the internal electrodes 12 (A+, A−) and the internal electrodes 12 (B+, B−) disposed at the top are omitted, and only the internal electrodes 12 (A+, A−) and the internal electrodes 12 (B+, B−) disposed at the bottom are provided. By disposing the internal electrodes in this way, it is possible to reduce the number of internal electrodes, which makes it possible to simplify the external wiring lines. Of course, the internal electrodes disposed at the bottom may be omitted and only the internal electrodes disposed at the top may be provided.

An ultrasonic motor according to a second embodiment of the present invention will be described below with reference to FIGS. 20 to 24.

In the ultrasonic motor according to the first embodiment described above, frequency control is performed using the vibration detection signal corresponding to the longitudinal vibration mode. In contrast, with the ultrasonic motor according to this embodiment, frequency control is performed using the vibration detection signal corresponding to the flexural vibration mode.

Figure 20:
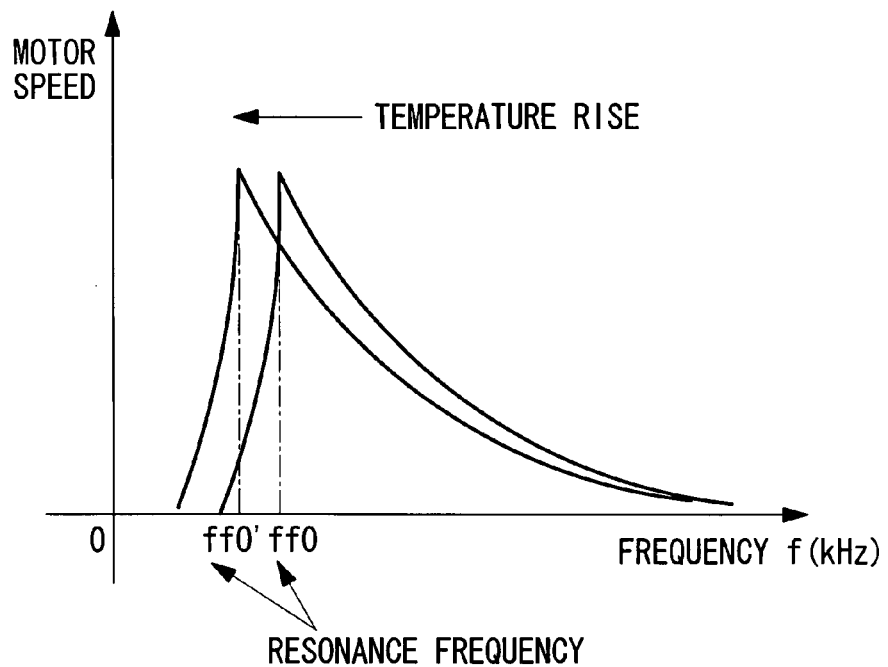
FIG. 20 is a graph showing a motor speed versus frequency relationship in the flexural vibration mode.
Figure 21:
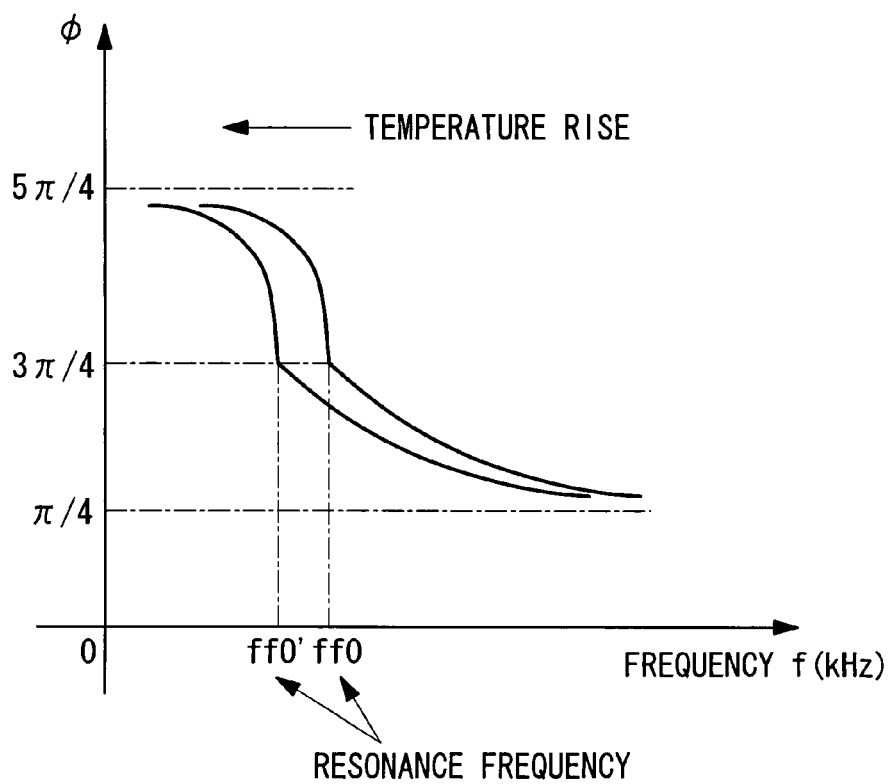
FIG. 21 is a graph showing a phase difference versus frequency characteristic in the flexural vibration mode.

Here, the resonance frequency in the flexural vibration mode exhibits the same behavior as the resonance frequency in the longitudinal vibration mode. In other words, as shown in FIG. 20, the resonance frequency in the flexural vibration mode decreases as the temperature increases. However, as shown in FIG. 21, even though the resonance frequency changes as the temperature increases, the phase difference $\phi$ between the A-phase driving control signal and the vibration detection signal corresponding to the flexural vibration mode remains constant. Therefore, also by controlling the frequency so that the phase difference $\phi$ between the A-phase driving control signal and the vibration detection signal corresponding to the flexural vibration mode is always constant, it is possible to keep the motor speed constant, and therefore, it is possible to always achieve stable motor efficiency.

In this embodiment, because it is necessary to detect the flexural vibration mode, the placement of the internal electrodes 12 on the piezoelectric ceramic sheets 11 is different from the placement according to the first embodiment described above.

A method and the configuration of an apparatus for detecting the flexural vibration mode will be described below with reference to FIGS. 22 to 24.

Figure 22:
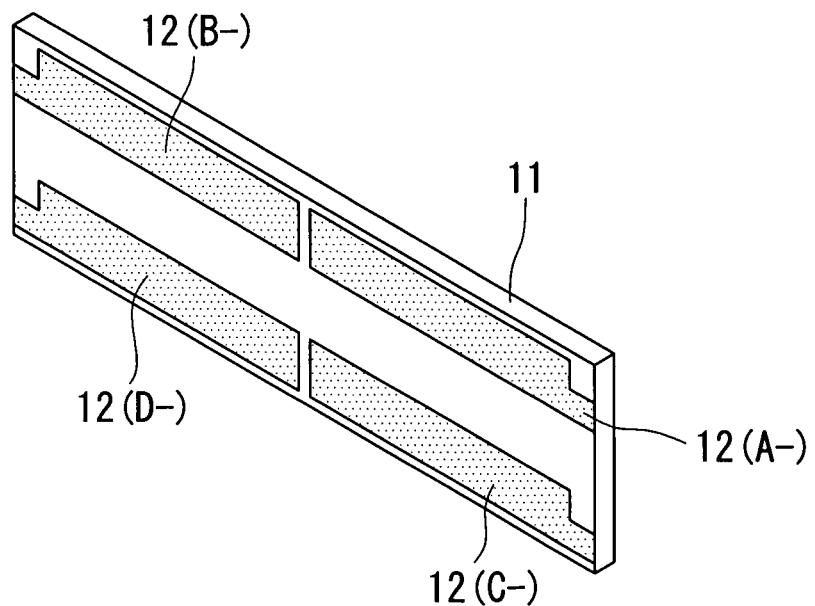
FIG. 22 is a perspective view showing a piezoelectric ceramic sheet constituting an ultrasonic vibrator according to a second embodiment of the present invention.
Figure 23:
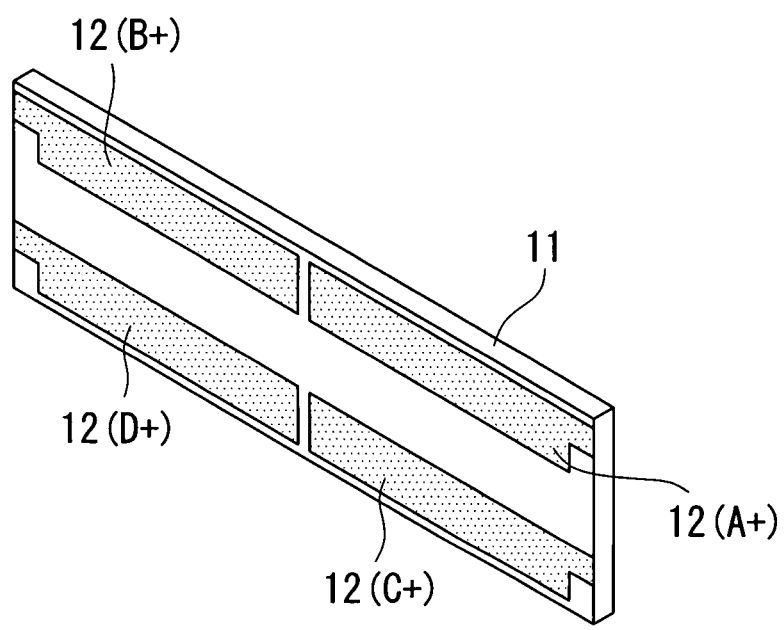
FIG. 23 is a perspective view showing a piezoelectric ceramic sheet constituting the ultrasonic vibrator according to the second embodiment of the present invention.

As shown in FIGS. 22 and 23, in the ultrasonic motor according to this embodiment, the internal electrodes 12 (C+, C−) located at the center in the width direction of the piezoelectric ceramic sheets 11 shown in FIGS. 4 and 5 are omitted, one of the A-phase electrodes (A+; the one located at the bottom left in FIG. 5) is used as a D-phase electrode (D+), one of the A-phase electrodes (A−; the one located at the bottom left in FIG. 4) is used as a D-phase electrode (D−), one of the B-phase electrodes (B+; the one located at the bottom right in FIG. 5) is used as a C-phase electrode (C+), and one of the B-phase electrodes (B−; the one located at the bottom right in FIG. 4) is used as a C-phase electrode (C−). FIG. 24 is a perspective view showing an ultrasonic vibrator according to this embodiment. A rectangular-block-shaped piezoelectric layered member 73 is formed by alternately laminating a plurality of the piezoelectric ceramic sheets 11 shown in FIGS. 22 and 23.

As shown in FIG. 24, the four external electrodes 17 formed at one end in the longitudinal direction of the piezoelectric layered member 73 are used as A-phase (A+, A−) and C-phase (C+, C−) electrodes, in this order from the other side face (the upper side in the figure) of the piezoelectric layered member 73, and the four external electrodes 17 formed at the other end are used as B-phase (B+, B−) and D-phase (D+, D−) electrodes, in this order from the other side face (the upper side in the figure) of the piezoelectric layered member 73. The A-phase and the B-phase external electrodes are for driving, and the C-phase and the D-phase external electrodes are for vibration detection.

Figure 25:
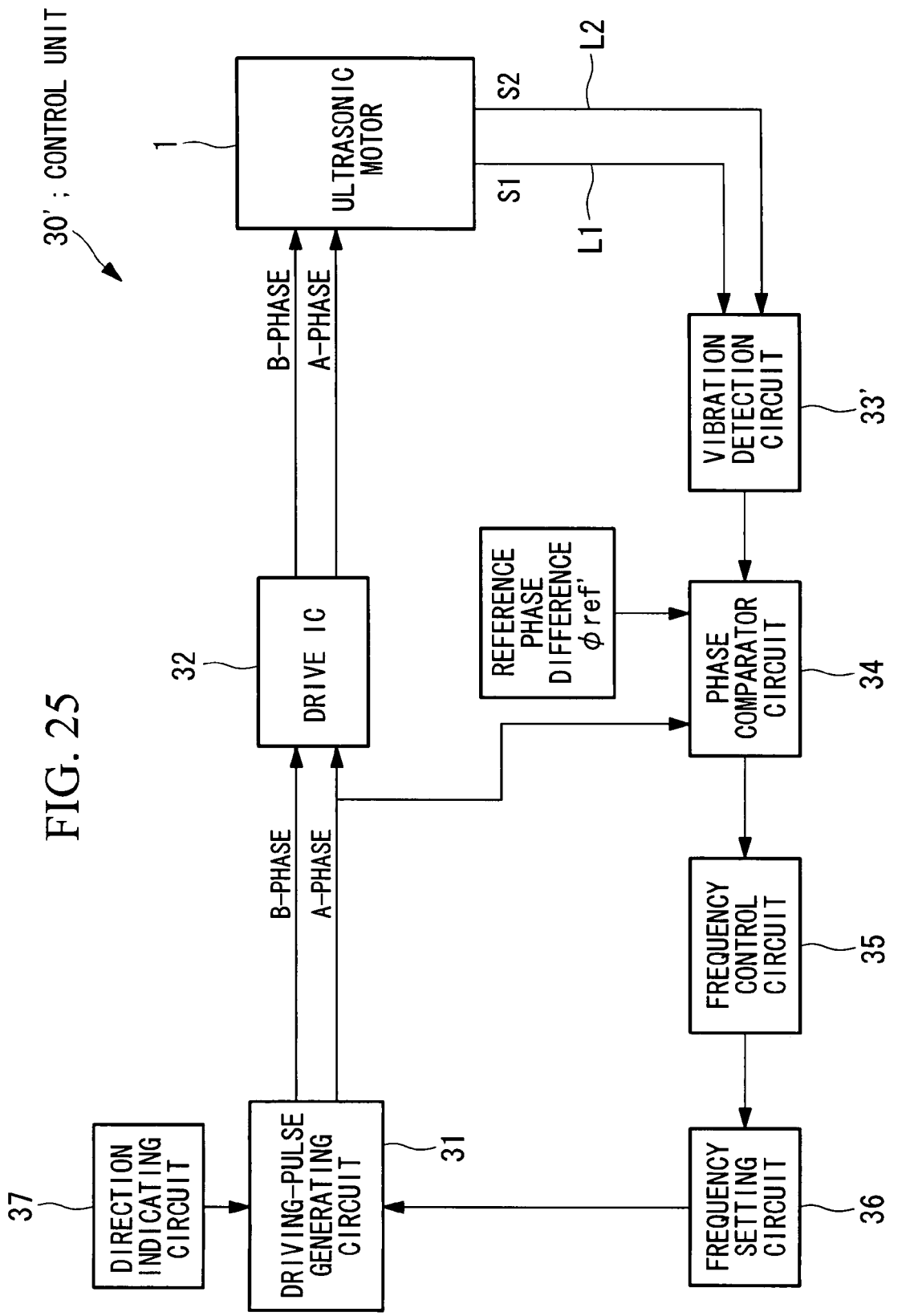
FIG. 25 is a diagram showing, in outline, the configuration of a control unit of the ultrasonic motor according to the second embodiment of the present invention.

Next, the external electrode 17 (C+) and the external electrode 17 (D−) are connected by a wiring line L1, the external electrode 17 (C−) and the external electrode 17 (D+) are connected by a wiring line L2, and this pair of wiring lines L1 and L2 are connected to the input side of a vibration detection circuit 33' in a control unit 30' of this embodiment (see FIG. 25).

Driving AC voltages corresponding to the resonance frequency applied to the A-phase and the B-phase electrodes with the same phase to excite a first-order longitudinal vibration, as shown in FIG. 6, whereupon the electrical charges generated in the regions at one face of the piezoelectric ceramic sheets 11, as shown in FIG. 9, are all positive electrical charges or negative electrical charges simultaneously excited in the first to fourth regions. In other words, when a negative electrical charge is excited in the internal electrode 12 (D−) in FIG. 22, a positive electrical charge is excited in the internal electrode 12 (C+) in FIG. 23, and when a negative electrical charge is excited in the internal electrode 12 (C−) in FIG. 22, a positive electrical charge is excited in the internal electrode 12 (D+) in FIG. 23. Therefore, the voltage between output terminals of the wiring lines L1 and L2 is constantly zero.

When driving AC voltages corresponding to the resonance frequency are applied to the A-phase and the B-phase electrodes with opposite phases to excite a second-order flexural vibration, as shown in FIG. 7, regarding the electrical charges generated in the regions on one face of the piezoelectric ceramic sheets 11, of the four regions, electrical charges of the same sign are simultaneously excited in regions located diagonally opposite and electrical charges of opposite sign are simultaneously excited in neighboring regions, as shown in FIG. 10. In other words, when a negative electrical charge is excited in the internal electrode 12 (D−) in FIG. 22, a negative electrical charge is excited in the internal electrode 12 (C+) in FIG. 23, and when a positive electrical charge is excited in the internal electrode 12 (C−) in FIG. 22, a positive electrical charge is excited in the internal electrode 12 (D+) in FIG. 23. Therefore, the voltage between the output terminals of the wiring line L1 and the wiring line L2 is finite and serves as a signal that is proportional to the flexural vibration.

As shown in FIG. 25, the vibration detection circuit 33' converts the voltage signal between the output terminals of the wiring line L1 and the wiring line L2 to a digital electrical signal by subjecting it to prescribed signal processing, such as level adjustment, noise removal, and binarization, and outputs this digital electrical signal to the phase comparator circuit 34 as a vibration detection signal of the flexural vibration. Accordingly, similarly to the first embodiment described above, frequency control is performed so that the phase difference $\phi$ between the vibration detection signal and the A-phase driving control signal becomes equal to the reference phase difference $\phi$ref'.

With the ultrasonic motor according to this embodiment, as described above, the internal electrodes 12 for vibration detection are provided at locations such that the total electrical charge generated in each region due to the flexural vibration mode takes a finite value and the total electrical charge generated in each region due to the longitudinal vibration mode is cancelled out to zero. Therefore, it is possible to detect only the flexural vibration mode via the internal electrodes 12 for vibration detection.

Furthermore, with the ultrasonic motor according to this embodiment, the vibration detection signal for the flexural vibration mode is generated on the basis of voltage signals S1 and S2 between the output terminals of the wiring lines L1 and L2, and the frequencies of the two-phase driving control signals are subjected to feedback control so that the phase difference $\phi$ between the vibration detection signal and the A-phase driving control signal becomes the reference phase difference $\phi$ref'. Therefore, it is possible to always maintain a constant motor speed even when the environmental temperature changes. Accordingly, it is possible to realize stable motor driving.

In the embodiment described above, PZT is used as the piezoelectric ceramic sheet. However, it is not limited thereto;

it is possible to use any type of piezoelectric element other than PZT, so long as it exhibits piezoelectric properties.

In each of the embodiments described above, silver palladium alloy is used as the material for the internal electrodes; instead of this, however, it is possible to use silver, nickel, or platinum.

Instead of bonding the sliding plate, which is made of zirconia ceramic, to the surface of the driven body 2, it is possible to attach zirconia ceramic to the surface of the driven body 2 by a thermal process.

In the embodiment described above, the internal electrodes for vibration detection are provided on all layers. However, the present invention is not limited thereto; it is possible to provide them on only one layer or on only a few layers.

What is claimed is:

1. An ultrasonic motor which, by applying two-phase driving AC voltages to an ultrasonic vibrator, simultaneously produces a longitudinal vibration mode and a flexural vibration mode in the ultrasonic vibrator, giving rise to a substantially elliptical vibration at an output end of the ultrasonic vibrator to move the ultrasonic vibrator and a driven body that is in contact with the ultrasonic vibrator relative to each other, the ultrasonic motor comprising:
    a control unit configured to detect a vibration detection signal corresponding to the longitudinal vibration mode, to detect a phase difference between the vibration detection signal and any one of the driving AC voltages, to set a driving frequency such that the phase difference becomes a prescribed value, and to apply each driving AC voltage with the set driving frequency to the ultrasonic vibrator;
    wherein the ultrasonic vibrator includes a piezoelectric layered body in which a plurality of piezoelectric elements are laminated;
    at least one of the piezoelectric elements includes an internal electrode for vibration detection disposed in a region where positive electrical charges or negative electrical charges are generated in the longitudinal vibration mode and where positive electrical charges and negative electrical charges in substantially the same amount as that of the positive electrical charges are generated in the flexural vibration mode; and
    the control unit detects the vibration detection signal on the basis of electrical signals from the internal electrode for vibration detection.

2. An ultrasonic motor according to claim 1, wherein the control unit comprises:
    a signal generator configured to generate two-phase driving control signals having the set driving frequency and a prescribed phase difference; and
    a driving circuit configured to generate the two-phase driving AC voltages with the driving frequency and the prescribed phase difference on the basis of the two-phase driving control signals output from the signal generator, and to apply the generated driving AC voltages to the ultrasonic vibrator;
    wherein the control unit detects a phase difference between any one of the driving control signals output from the signal generator and the vibration detection signal.

3. An ultrasonic motor which, by applying two-phase driving AC voltages to an ultrasonic vibrator, simultaneously produces a longitudinal vibration mode and a flexural vibration mode in the ultrasonic vibrator, giving rise to a substantially elliptical vibration at an output end of the ultrasonic vibrator to move the ultrasonic vibrator and a driven body that is in contact with the ultrasonic vibrator relative to each other, the ultrasonic motor comprising:
    a control unit configured to detect a vibration detection signal corresponding to the flexural vibration mode, to detect a phase difference between the vibration detection signal and any one of the driving AC voltages, to set a driving frequency such that the phase difference becomes a prescribed value, and to apply each driving AC voltage with the set driving frequency to the ultrasonic vibrator;
    wherein the ultrasonic vibrator includes a piezoelectric layered body in which a plurality of pairs of piezoelectric elements disposed adjacently to each other are laminated:
    in the plurality of the pairs of piezoelectric elements, each of the piezoelectric elements of at least one pair of the piezoelectric elements includes at least two internal electrodes for vibration detection consisting of the first internal electrode disposed in a region where positive electrical charges or negative electrical charges are generated and the second internal electrode disposed in a region where the opposite sign of the electrical charges in substantially the same amount as that of the electrical charges detected by the first internal electrode are generated in the flexural vibration mode; and
    the control unit detects the vibration detection signal on the basis of electrical signals from the internal electrodes for vibration detection.

4. An ultrasonic motor according to claim 3, wherein the control unit comprises:
    a signal generator configured to generate two-phase driving control signals having the set driving frequency and a prescribed phase difference; and
    a driving circuit configured to generate the two-phase driving AC voltages with the driving frequency and the prescribed phase difference on the basis of the two-phase driving control signals output from the signal generator, and to apply the generated driving AC voltages to the ultrasonic vibrator; and
    wherein the control unit detects a phase difference between any one of the driving control signals output from the signal generator and the vibration detection signal.

* * * * *